United States Patent
El-Chammas et al.

(10) Patent No.: US 12,385,972 B2
(45) Date of Patent: Aug. 12, 2025

(54) LATCHUP DETECTOR AND CLOCK LOSS DETECTOR

(71) Applicant: Omni Design Technologies, Inc., Milpitas, CA (US)

(72) Inventors: Manar Ibrahim El-Chammas, Austin, TX (US); Vaibhav Tripathi, Santa Clara, CA (US); Jagdish Kumar Agrawal, Banagalore (IN)

(73) Assignee: Omni Design Technologies, Inc., Milpitas, CA (US)

( * ) Notice: Subject to any disclaimer, the term of this patent is extended or adjusted under 35 U.S.C. 154(b) by 184 days.

(21) Appl. No.: 18/158,624

(22) Filed: Jan. 24, 2023

(65) Prior Publication Data

US 2024/0248134 A1     Jul. 25, 2024

(51) Int. Cl.
*G01R 31/317*     (2006.01)
*H03K 19/003*     (2006.01)
*H03K 19/0175*     (2006.01)

(52) U.S. Cl.
CPC . *G01R 31/31727* (2013.01); *G01R 31/31721* (2013.01); *H03K 19/0033* (2013.01); *H03K 19/017509* (2013.01)

(58) Field of Classification Search
CPC ....... H03K 19/0033; H03K 19/017509; G01R 31/31727; G01R 31/31721
See application file for complete search history.

(56) References Cited

U.S. PATENT DOCUMENTS

| | | | | |
|---|---|---|---|---|
| 5,212,616 A * | 5/1993 | Dhong | ............... | H01L 27/0921 361/88 |
| 5,642,069 A * | 6/1997 | Waite | ............... | G06F 11/0751 714/E11.002 |
| 6,177,814 B1 * | 1/2001 | Taguchi | ............... | G11B 7/126 327/91 |
| 7,355,437 B2 * | 4/2008 | Perisetty | ............... | H03K 19/00315 326/14 |
| 7,492,560 B2 * | 2/2009 | Hussein | ............... | H01L 27/0921 361/91.1 |
| 7,692,906 B2 * | 4/2010 | Tailliet | ............... | H10D 84/854 361/87 |
| 8,004,338 B2 * | 8/2011 | Sugie | ............... | H03K 4/50 327/291 |
| 11,108,358 B2 * | 8/2021 | Girani | ............... | H03L 7/18 |

* cited by examiner

*Primary Examiner* — Menatoallah Youssef
*Assistant Examiner* — Colleen J O Toole
(74) *Attorney, Agent, or Firm* — Intrinsic Law Corp.

(57) ABSTRACT

A latchup detector includes a level shifter and a comparator. The level shifter is electrically coupled to a voltage supply rail to receive as inputs a regulator output voltage and a target supply voltage. The level shifter includes a first level-shifter circuit that lowers the regulator output voltage to a first voltage and a second level-shifter circuit that lowers the target supply voltage to a second voltage. The comparator receives as inputs the first and second voltages. The comparator produces a first output voltage when the difference between the first and second voltages is greater than or equal to a predetermined voltage difference and a second output voltage when the difference between the first and second voltages is less than the predetermined voltage difference. The first output voltage can correspond to a latchup event.

13 Claims, 13 Drawing Sheets

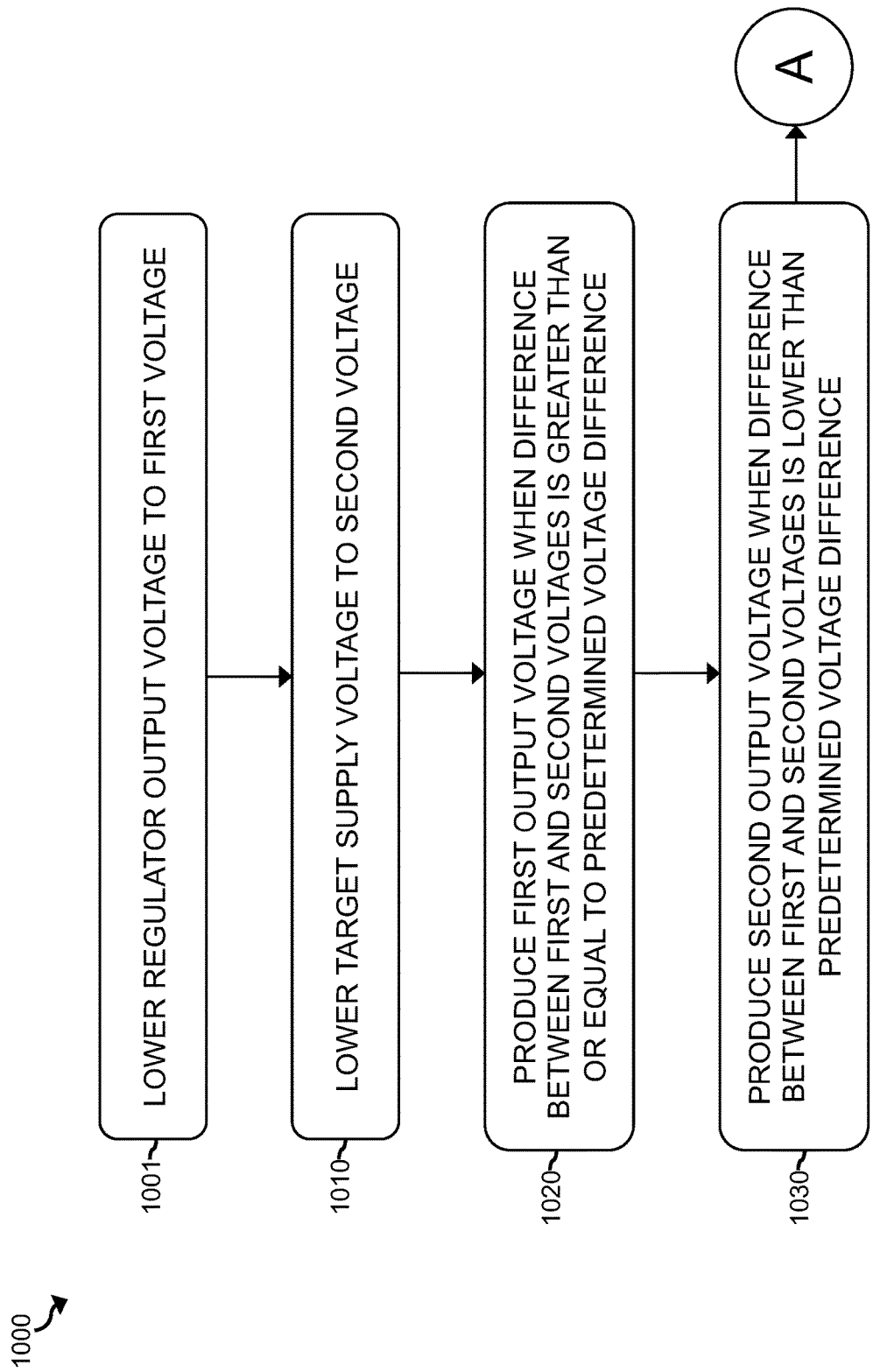

LATCHUP DETECTOR AND CLOCK LOSS DETECTOR

TECHNICAL FIELD

This application relates generally to microelectronics.

BACKGROUND

Chips sent to orbit are susceptible to radiation particles that can disrupt the chip's operation is several ways. For example, these particles can flip the state of a register, thus changing the programmed state of a system-on-a-chip (SoC). In addition, these particles can trigger latchup events, where the parasitic bipolars are triggered, resulting in sustained current that can potentially damage the chip (e.g., due to excessive current) or impact the performance. These events typically cannot be detected a priori, and in addition, there is no mechanism to detect such an event after it occurs.

Radiation-hardened (rad-hard) design provides design and layout methodologies to reduce the risk of a latchup event. One example of a rad-hard methodology is to separate the NMOS and PMOS transistors with guard rings to help isolate the parasitic bipolars and reduce the substrate resistance. A disadvantage is that this methodology usually increases the active area of the circuitry.

Another example of a rad-hard methodology is making the digital registers more robust to radiation. For example, the digital registers can include TMR (triple modular redundancy) where multiple flops are used to store one bit, and a majority detector is used to detect bit flips caused by radiation. Alternatively, custom-designed digital registers that incorporate RC filtering can be used to average out glitches and reduce the probability of bit flips caused by radiation.

However, these rad-hard methodologies do not detect a latchup event on a system level. System-level detection is valuable because it can enable the system to act, such as by turning off the power supplies, in a way that is not possible with the above schemes. This is especially important with integrated circuits that were not designed with a rad-hard philosophy.

SUMMARY

Example embodiments described herein have innovative features, no single one of which is indispensable or solely responsible for their desirable attributes. The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Without limiting the scope of the claims, some of the advantageous features will now be summarized. Other objects, advantages and novel features of the disclosure will be set forth in the following detailed description of the disclosure when considered in conjunction with the drawings, which are intended to illustrate, not limit, the invention.

An aspect of the invention is directed to a latchup detector comprising: a level shifter and a comparator. The level shifter comprises: a first level-shifter circuit having an input electrically coupled to an output of a voltage regulator, the output having a regulator output voltage, the first level-shifter circuit configured to lower the regulator output voltage to a first voltage; and a second level-shifter circuit having an input electrically coupled to an input of a chip, the input of the chip having a target supply voltage, the second level-shifter circuit configured to lower the target supply voltage to a second voltage, the second voltage lower than the first voltage, wherein a voltage supply rail is electrically coupled to the output of the voltage regulator and to the input of the chip. The comparator has a first input electrically coupled to an output of the first level-shifter circuit to receive the first voltage and a second input electrically coupled to an output of the second level-shifter circuit to receive the second voltage, the comparator configured to produce a first output voltage when a difference between the first and second voltages is greater than or equal to a predetermined voltage difference and a second output voltage when the difference between the first and second voltages is less than the predetermined voltage difference.

In one or more embodiments, the first and second voltages are lower than a latchup threshold voltage. In one or more embodiments, the latchup threshold voltage is less than or equal to about 0.9V and greater than or equal to about 0.75V.

In one or more embodiments, the comparator has a variable-threshold such that the predetermined voltage difference is programmable. In one or more embodiments, the latchup detector comprises a unity gain buffer having a first input electrically coupled to the output of the first level-shifter circuit and a second input electrically coupled to the output of the second level-shifter circuit; a resistor ladder having an input electrically coupled to an output of the unity gain buffer; and a multiplexer selectively electrically coupled to one or more resistors in the resistor ladder, the multiplexer having an output electrically coupled to the comparator. In one or more embodiments, the resistor(s) to which the multiplexer is electrically coupled corresponds to a programmability of the predetermined voltage difference.

In one or more embodiments, the first voltage corresponds to an interrupt signal for the chip. In one or more embodiments, the latchup detector further comprises a digital controller having an input electrically to an output of the comparator to receive the first and second output voltages, the digital controller configured to: convert the first and second output voltages into first and second digital signals, respectively, and produce an interrupt signal when a time-weighted average of the first and second digital signals is greater than a predetermined value. In one or more embodiments, an output of the digital controller is electrically coupled to a processor on the chip to receive the interrupt signal. In one or more embodiments, the interrupt signal comprises a persistent interrupt signal.

In one or more embodiments, the latchup detector further comprises a digital state machine having an input electrically to an output of the comparator to receive the first and second output voltages, the digital state machine configured to: convert the first and second output voltages into first and second digital signals, respectively; and pass a conversion of the first and second digital signals through an accumulator that converges towards a target state.

Another aspect of the invention is directed to a latchup detection system comprising: a voltage regulator; a chip comprising a microprocessor; a voltage supply rail having a first end electrically coupled to an output of the voltage regulator and a second end electrically coupled to an input of the chip; a voltage feedback circuit that electrically couples the second end of the voltage supply rail to an input of the voltage regulator, wherein: the output of the voltage regulator has a regulator output voltage, the regulator output voltage is lowered to a target supply voltage at the second end of the voltage supply rail, and the voltage regulator is configured to adjust the target supply voltage to maintain the target supply voltage; a latchup detector; and a comparator. The latchup detector comprises: a level shifter that comprises: a first level-shifter circuit having an input electrically coupled to the first end of the voltage supply rail to receive the regulator output voltage, the first level-shifter circuit configured to lower the regulator output voltage to a first voltage; and a second level-shifter circuit having an input electrically coupled to the input of a chip to receive the target supply voltage, the second level-shifter circuit configured to lower the target supply voltage to a second voltage, the second voltage lower than the first voltage. The comparator has a first input electrically coupled to an output of the first level-shifter circuit to receive the first voltage and a second input electrically coupled to an output of the second level-shifter circuit to receive the second voltage, the comparator configured to produce a first output voltage when a difference between the first and second voltages is greater than or equal to a predetermined voltage difference and a second output voltage when the difference between the first and second voltages is less than the predetermined voltage difference.

Another aspect of the invention is directed to a method for detecting a latchup event, comprising: in a latchup detector comprising a level shifter and a comparator, where the level shifter comprises: a first level-shifter circuit having an input electrically coupled to an output of a voltage regulator, the output having a regulator output voltage; and a second level-shifter circuit having an input electrically coupled to an input of a chip, the input of the chip having a target supply voltage, wherein a voltage supply rail is electrically coupled to the output of the voltage regulator and to the input of the chip; and the comparator comprises: a first input electrically coupled to an output of the first level-shifter circuit to receive a first voltage and a second input electrically coupled to an output of the second level-shifter circuit to receive a second voltage, wherein the method comprises: lowering the regulator output voltage, with the first level-shifter circuit, to the first voltage; lowering the target supply voltage, with the second level-shifter circuit, to the second voltage; producing, with the comparator, a first output voltage when a difference between the first and second voltages is greater than or equal to a predetermined voltage difference; and producing, with the comparator, a second output voltage when the difference between the first and second voltages is less than the predetermined voltage difference.

In one or more embodiments, the first and second voltages are lower than a latchup threshold voltage. In one or more embodiments, the comparator has a variable-threshold and the method further comprises programmably setting the predetermined voltage difference. In one or more embodiments, the method further comprises: with a digital controller having an input electrically to an output of the comparator to receive the first and second voltages: converting the first and second output voltages into first and second digital signals, respectively; and producing an interrupt signal when a time-weighted average of the first and second digital signals is greater than a predetermined value.

Another aspect of the invention is directed to a clock-loss detector circuit comprising: a clock edge detector having an input electrically coupled to a clock signal, the clock edge detector configured to produce a pulse signal in response to a rising edge and/or a falling edge of the clock signal, the pulse signal having a high value for a first time period and a low value for a second time period, the second time period longer than the first time period; a reset transistor electrically coupled to an output of the clock edge detector and to ground, the reset transistor electrically coupled to ground when the pulse signal has the high value, the reset transistor electrically decoupled from ground when the pulse signal has the low value; an output line electrically coupled to the reset transistor, the output line having an output voltage, the output voltage equal to zero when the reset transistor is electrically coupled to ground; a capacitor electrically coupled to the output line; a current source electrically coupled to the capacitor; and a voltage detector electrically coupled to the output line to measure the output voltage, wherein the voltage detector is configured to produce an output signal when the output voltage is higher than a predetermined value.

In one or more embodiments, the output voltage increases while the reset transistor is electrically decoupled from ground. In one or more embodiments, the current source comprises a resistor electrically coupled in series with a power supply.

Another aspect of the invention is directed to a method for detecting clock loss, comprising: producing a pulse signal in response to each rising edge and/or each falling edge of a clock signal, the pulse signal having a high value and a low value; electrically coupling an output voltage in an output line to a first voltage when the pulse signal has the high value; when the pulse signal has the low value: electrically decoupling the output voltage from the first voltage; and charging a capacitor that is electrically coupled to the output line to increase the output voltage; and producing an output signal the output voltage is higher than a predetermined value that is higher than the first voltage.

BRIEF DESCRIPTION OF THE DRAWINGS

For a fuller understanding of the nature and advantages of the concepts disclosed herein, reference is made to the detailed description of preferred embodiments and the accompanying drawings.

DETAILED DESCRIPTION

A latchup detector is configured to measure the regulator output voltage Vx of a voltage regulator on a first side of a voltage supply rail for a microchip, and the target supply voltage Vy on the second side of the voltage supply rail at the voltage-supply input to the microchip. The latchup detector is configured to operate on a latchup-insensitive voltage that is lower than the latchup holding voltage.

The latchup detector includes a level shifter and a comparator. The level shifter is configured to lower (e.g., proportionally lower) the regulator output voltage Vx and the target supply voltage Vy to first and second voltages. The first and second voltages are voltages that are compatible with the latchup-insensitive operating voltage of the latchup detector. The comparator is configured to produce a first output voltage when the difference between the first and second voltages is greater than or equal to a predetermined voltage difference and a second output voltage when the difference between the first and second voltages is less than the predetermined voltage difference. The first output voltage can correspond and/or can indicate the detection of a latchup event.

The comparator can have a variable threshold such that the predetermined voltage difference is programmable. Alternatively, a variable-threshold circuit can be electrically coupled to an input of the comparator to provide a programmable predetermined voltage difference.

A digital controller can be electrically coupled to the output of the comparator to receive the first and second voltages. The digital controller can be configured to convert the first and second output voltages into first and second digital signals, respectively. The digital controller can further be configured to produce an interrupt signal when a time-weighted average of the first and second digital signals is greater than a predetermined value. The interrupt signal can be a persistent interrupt signal.

Figure 1:
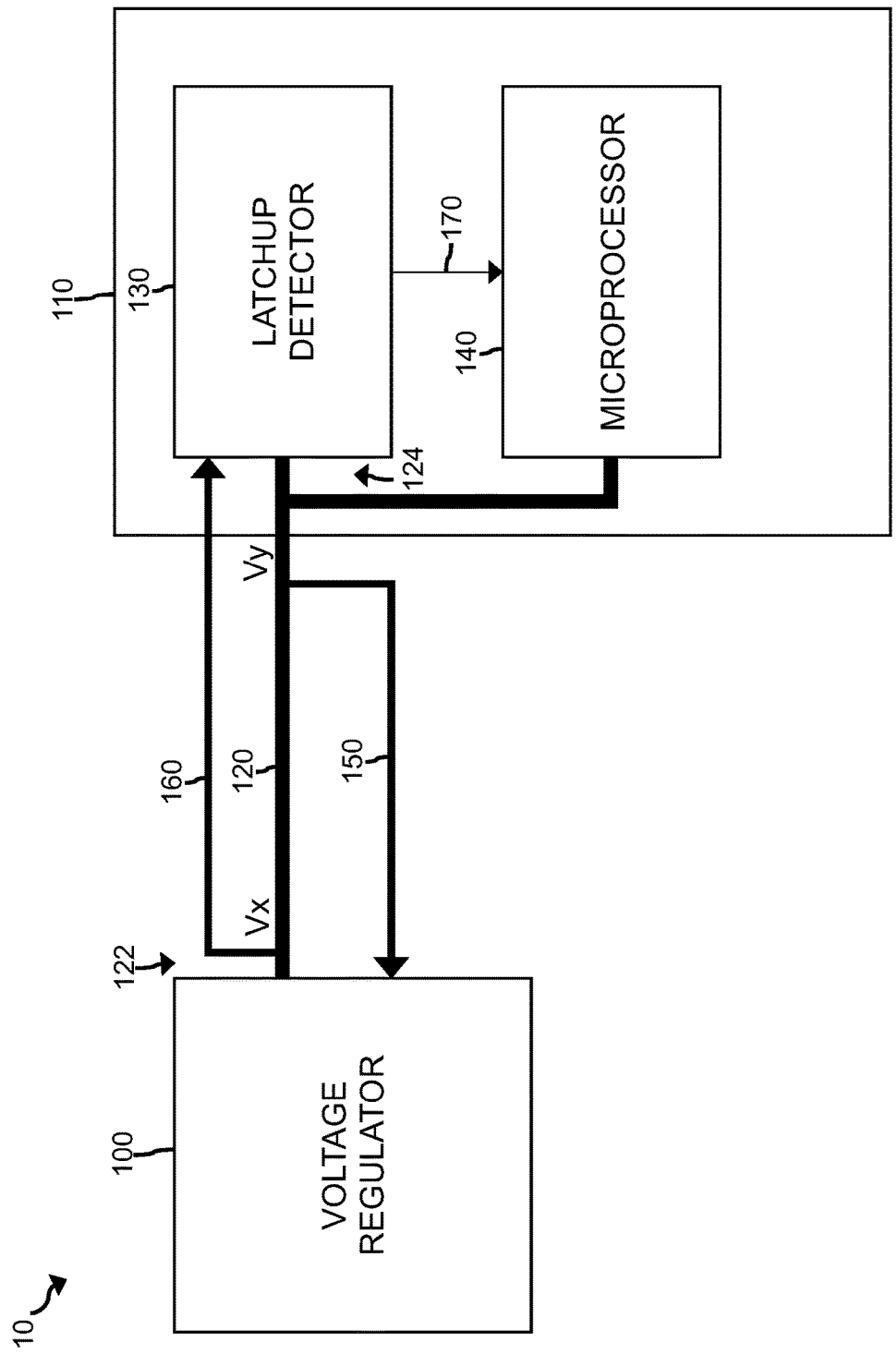
FIG. 1 is a block diagram of a system having latchup detection circuitry according to an embodiment.

FIG. 1 is a block diagram of a system 10 having latchup detection circuitry according to an embodiment. The system 10 includes a voltage regulator 100, a microchip 110, and a voltage supply rail or bus 120. A latchup detector 130 and a microprocessor 140 are formed on the chip 110. The microprocessor 140 can comprise a central processing unit (CPU). The chip 110 can be or represent a system-on-a-chip (SoC), a system-in-a-package (SiP), a package-on-a-package (POP), a logic chip, or another chip. When the chip 110 is an SoC, the chip 110 includes additional circuitry such as computer memory and/or interfaces to computer memory, a digital signal processor (DSP), a graphics processing unit (GPU), radio modems, communication busses, and/or other circuitry. In some embodiments, the system 10 can be mounted on a printed circuit board (PCB).

The voltage regulator 100 is electrically coupled and/or electrically connected to a first end 122 of the voltage supply rail 120. The latchup detector 130 and the microprocessor 140 are electrically coupled and/or electrically connected to a second end 124 of the voltage supply rail 120. The voltage regulator 100 is configured to produce a regulator output voltage Vx. The regulator output voltage Vx decreases to a target supply voltage Vy for the chip 110 at the second end 124 of the voltage supply rail 120 due to the routing resistance of the voltage supply rail 120. The voltage regulator 100 is configured to receive the target supply voltage Vy as feedback (e.g., as an input), through a voltage regulator feedback circuit 150, to modulate the regulator output voltage Vx to achieve the target supply voltage Vy. For example, when the target supply voltage Vy is 1.2V, the routing resistance of the voltage supply rail 120 is 1 ohm, and the supply current is 100 mA, then the IR drop across the voltage supply rail 120 is 100 mV. With the force-sense feedback of the voltage regulator 100 (e.g., using voltage regulator feedback circuit 150), the voltage regulator 100 will produce a regulator output voltage Vx of 1.3V such that the target supply voltage Vy is 1.2V.

The latchup detector 130 is configured to operate at a supply voltage that is lower than a latchup threshold voltage (e.g., latchup holding voltage) such that the latchup detector operates at a latchup-insensitive voltage. The latchup detector 130 receives as inputs the regulator output voltage Vx and the target supply voltage Vy. The regulator output voltage Vx is supplied to the latchup detector 130 through a feedforward circuit 160 that is electrically coupled and/or electrically connected to the first end 122 of the voltage supply rail 120 and to the latchup detector 130. The latchup detector 130 is configured to lower (e.g., proportionally lower) the regulator output voltage Vx and the target supply voltage Vy to first and second voltages, respectively, that are latchup-insensitive and that are compatible with the supply voltage of the latchup detector 130. After the input voltages are lowered, the latchup detector 130 measures the difference between the first and second voltages and produces an output signal, such as an interrupt signal, when the difference between the first and second voltages is greater than or equal to a predetermined voltage difference.

Under normal operation (i.e., without a latchup event), the latchup detector 130 determines that the difference between the first and second voltages is lower than the predetermined voltage difference. For example, continuing with the example of the regulator output voltage Vx of 1.3V, the target supply voltage Vy of 1.2V, supply current of 100 mA, and routing resistance of the voltage supply rail 120 of 1 ohm, under normal operation the difference between the regulator output voltage Vx and the target supply voltage Vy is 100 mV. In one example, the regulator output voltage Vx and the target supply voltage Vy are proportionally lowered by 50%, such that the first and second voltages are 0.65V and 0.6V, respectively, under normal operation. In this example, the predetermined voltage difference can be 75 mV (e.g., 75 mV to 125 mV). In this case, the latchup detector 130 does not produce an output signal, such as an interrupt signal, since the difference between the first and second voltages (50 mV) is less than the predetermined voltage difference of 75 mV. Alternatively, the latchup detector 130 can produce a first output signal when the difference between the first and second voltages is less than the predetermined voltage difference and a second output signal (e.g., an interrupt output signal) when the difference between the first and second voltages is greater than or equal to the predetermined voltage difference.

When a latchup event occurs, the supply current increases, for example to 200 mA, which causes the voltage drop across the voltage supply rail 120 to increase to 200 mV. As a result, the voltage regulator 100 increases the regulator output voltage Vx to 1.4V to maintain the target supply voltage Vy of 1.2V. When the regulator output voltage Vx and the target supply voltage Vy are proportionally lowered by 50% (e.g., following the example above), the first and second voltages are 0.7V and 0.6V, respectively, in the case of a latchup event. In this case, the latchup detector 130 produces an output signal, such as an interrupt signal, since the difference between the first and second voltages (100 mV) is greater than the predetermined voltage difference of 75 mV. The interrupt signal can be a persistent interrupt signal. The microprocessor 140 receives the interrupt signal through connection 170. The microprocessor 140 can be configured to act on the interrupt signal, for example by shutting down or restarting the voltage regulator 100 and/or another power supply.

Figure 2:
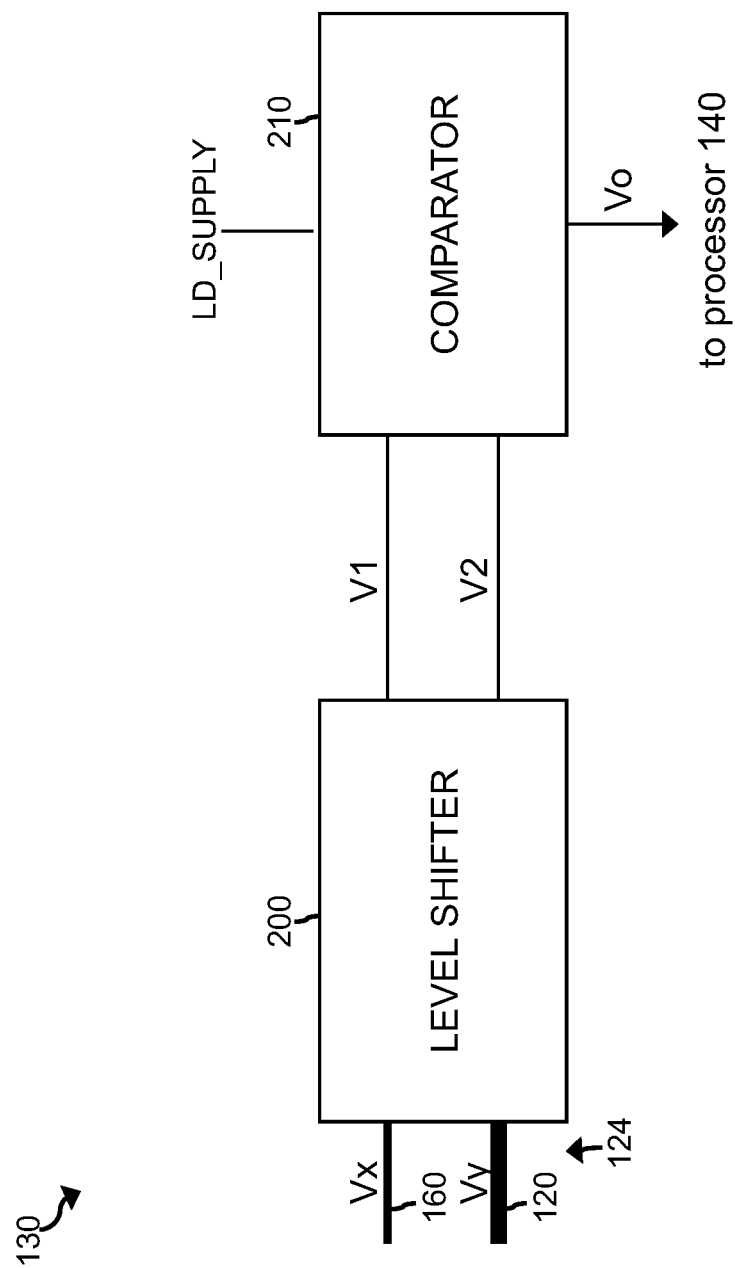
FIG. 2 is a block diagram of the latchup detector illustrated in FIG. 1 according to an embodiment.

FIG. 2 is a block diagram of the latchup detector 130 according to an embodiment. The latchup detector 130 includes a level shifter 200 and a comparator 210. The level shifter 200 has a first input that is electrically coupled to and/or electrically connected to the feedforward circuit 160 to receive the regulator output voltage Vx. The level shifter 200 has a second input that is electrically coupled to and/or electrically connected to the second end 124 of the voltage supply rail 120 (and/or to the input of the chip 110) to receive the target supply voltage Vy. The level shifter 200 includes passive electrical devices that lower (e.g., proportionally lower) the regulator output voltage Vx and the target supply voltage Vy to first and second voltages V1, V2, respectively. For example, the level shifter 200 can include a voltage divider coupled to each input voltage Vx, Vy.

The first and second voltages V1, V2 are configured to be compatible with the supply voltage of the latchup detector 130, for example with the LD_SUPPLY voltage for the comparator 210. For example, the first and second voltages V1, V2 can be set to be within the operating range of the latchup detector 130. The operating range of the latchup detector 130 can be different that the voltage inputs that are being monitored in which case the voltage inputs are level-shifted into the appropriate operating range. The LD_SUPPLY voltage is lower than the latchup threshold voltage (e.g., latchup holding voltage) such that the comparator 210 operates at a latchup-insensitive voltage. The latchup threshold voltage can be about 0.9V in which case the LD_SUPPLY voltage can be about 0.6V to about 0.8V, including about 0.65V, about 0.7V, about 0.75V, or any value or range between any two of the foregoing voltages. As used herein, "about" means plus or minus 10% of the relevant value.

The comparator 210 is configured to produce an output voltage Vo having a first value when a latchup event occurs (e.g., when the difference between the first and second voltages V1, V2 is greater than a predetermined threshold value) and a second value during normal operation (i.e., when no latchup events occur). For example, the comparator 210 can be configured to compare $(Vy-V_{REF})$ and Vx, such that the output voltage Vo represents a digital 1 when $(Vy-V_{REF})>Vx$ and the output voltage Vo represents a digital 0 when $(Vy-V_{REF}) \leq Vx$. The output voltage Vo is received by the microprocessor 140 (FIG. 1). The microprocessor 140 can be configured and/or programmed to interpret the output voltage Vo as an interrupt signal when the output voltage Vo is higher than a predetermined voltage/voltage difference (e.g., as discussed above with respect to FIG. 1). In some embodiments, the comparator 210 can include or can be electrically coupled to a variable-threshold circuit.

Figure 3:
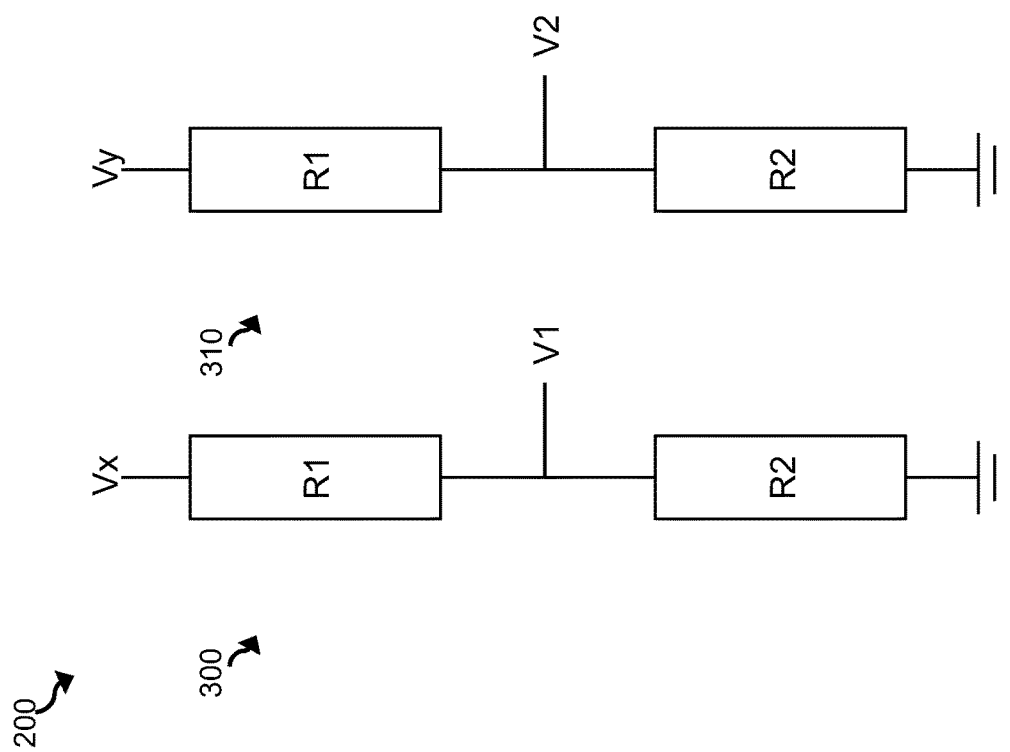
FIG. 3 is a block diagram of the level shifter illustrated in FIG. 2 according to an embodiment.

FIG. 3 is a block diagram of the level shifter 200 according to an embodiment. In this embodiment, the level shifter 200 includes first and second level-shifter circuits 300, 310, which can function as first and second voltage-divider circuits, respectively. The first level-shifter circuit 300 has an input that is electrically coupled to and/or electrically connected to the feedforward circuit 160 to receive the regulator output voltage Vx. The first level-shifter circuit 300 has an output having the first voltage V1 which is lower than the regulator output voltage Vx. The second level-shifter circuit 310 has an input that is electrically coupled to and/or electrically connected to the second end 124 of the voltage supply rail 120 to receive the target supply voltage Vy. The second level-shifter circuit 310 has an output having the second voltage V2 which is lower than the target supply voltage Vy.

The first and second level-shifter circuits 300, 310 are preferably identical to lower the regulator output voltage Vx and the target supply voltage Vy by the same proportion. For example, in the embodiment illustrated in FIG. 3, the first and second level-shifter circuits 300, 310 each include first and second resistors R1, R2 that are electrically connected in series. The respective input voltage (Vx, Vy) is electrically connected to a first terminal of the first resistor R1 in each level-shifter circuit 300, 310. The respective output voltage (V1, V2) is electrically connected to the electrical connection (e.g., wire) between the first and second resistors R1, R2 in each level-shifter circuit 300, 310.

Figure 4:
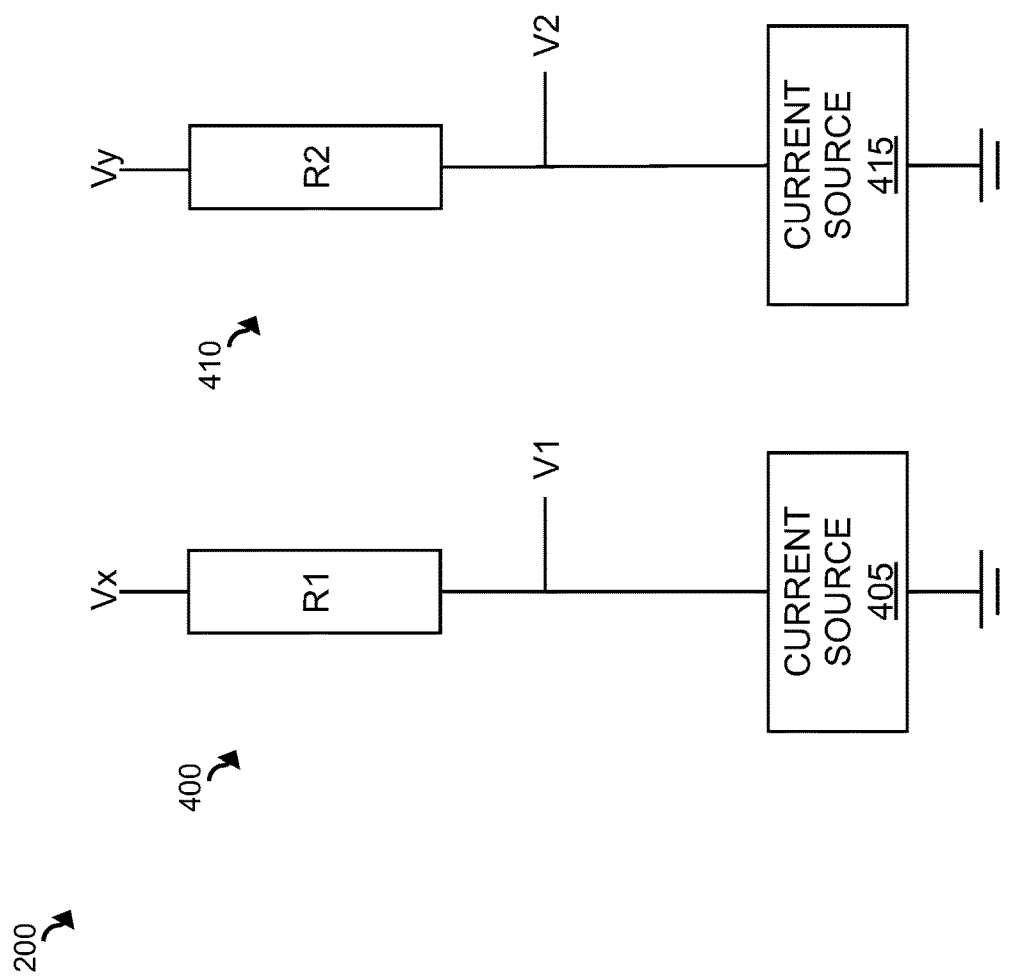
FIG. 4 is a block diagram of the level shifter illustrated in FIG. 2 according to another embodiment.

FIG. 4 is a block diagram of the level shifter 200 according to another embodiment. In this embodiment, the level shifter 200 includes first and second level-shifter circuits 400, 410. The first level-shifter circuit 400 includes a resistor R1 and a current source 405. A first terminal of the resistor R1 is electrically coupled to the regulator output voltage Vx. A second terminal of the resistor R1 is electrically coupled to the current source 405 and to an output voltage terminal for V1. The second level-shifter circuit 410 includes a resistor R2 and a current source 415. A first terminal of the resistor R2 is electrically coupled to the target supply voltage Vy. A second terminal of the resistor R2 is electrically coupled to the current source 415 and to an output voltage terminal for V2.

Figure 5:
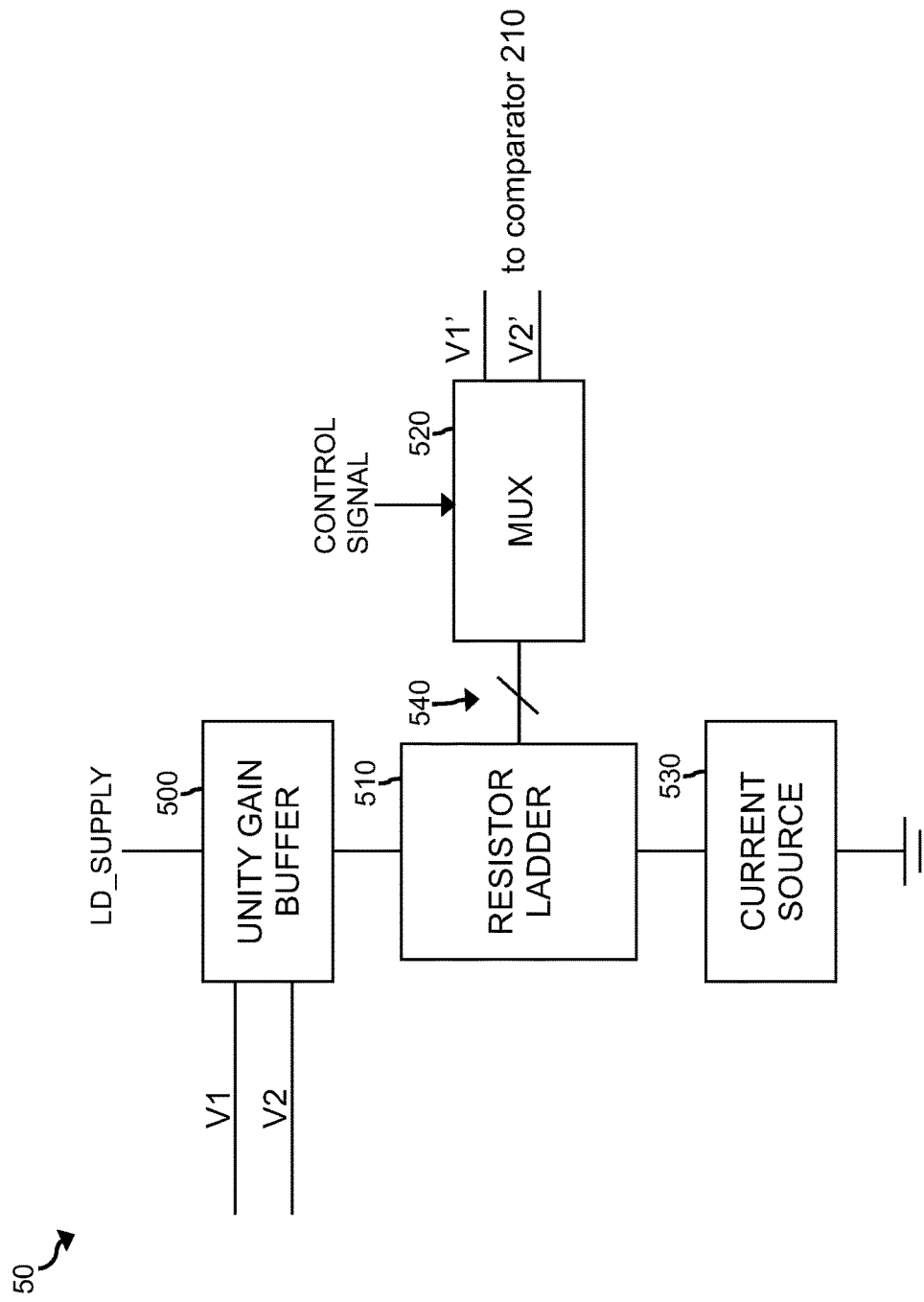
FIG. 5 is a block diagram of a variable-threshold circuit according to an embodiment.

FIG. 5 is a block diagram of a variable-threshold circuit 50 according to an embodiment. The variable-threshold circuit 50 includes an optional unity gain buffer 500, a resistor ladder 510, a multiplexer 520, and a current source 530. The variable-threshold circuit 50 can be separate from or combined with (e.g., integrated with) the comparator 210. In the embodiment illustrated in FIG. 5, the variable-threshold circuit 50 is separate from the comparator 210. In the embodiment illustrated in FIG. 6, the variable-threshold circuit 50 is combined with the comparator 210 in the same circuit.

The optional unity gain buffer 500 has first and second inputs that are electrically coupled and/or electrically connected to the first and second outputs of the level shifter 200 (FIGS. 2, 3). For example, the first input of the optional unity gain buffer 500 can be electrically coupled and/or electrically connected to the output of the first level-shifter circuit 300 (FIG. 3) to receive the first voltage V1, and the second input of the optional unity gain buffer 500 can be electrically coupled and/or electrically connected to the output of the second level-shifter circuit 310 (FIG. 3) to receive the second voltage V2. The optional unity gain buffer 500 operates at the LD_SUPPLY voltage to prevent latchup. In an embodiment, the unity gain buffer 500 can be a source follower. The optional unity gain buffer 500 can isolate the active sources and drains from higher supplies.

The output of the unity gain buffer 500 is electrically coupled and/or electrically connected to an input of a resistor ladder 510. The resistor ladder 510 is electrically connected, via bus 540, to a multiplexer 520 that is configurable to be selectively electrically connected to one or more resistors in the resistor ladder 510 to achieve a selected or target voltage increase, which corresponds to a selected or target voltage offset, which can be applied to either V1 or V2 individually or to both V1 and V2 differentially. The multiplexer 520 has an input to receive a control signal to configure the electrical connection to the resistor(s) in the resistor ladder 510. The optional unity gain buffer 500 can isolate the inputs to the latchup detector 130 (FIGS. 1, 2), which are higher than the latchup holding voltage. For example, the multiplexer 520 can include transistors, and the source and drain of the transistors in the multiplexer 520 would have a direct path to the inputs to the latchup detector 130 (via the resistor ladder 510) if the optional unity gain buffer 500 is not included.

The multiplexer 520 has first and second outputs that have first and second offset voltages V1', V2', respectively, which are higher than the respective first and second voltages V1, V2. The offset voltages V1', V2' are provided to the comparator 210. The programmable offset voltages (and programmable threshold voltage) can compensate for the voltage (IR) drop across the voltage supply rail 120 during normal operation (i.e., no latchup event). The programmable offset voltages (and programmable threshold voltage) can be calibrated, such as during initialization or startup of the system 10.

Figure 7:
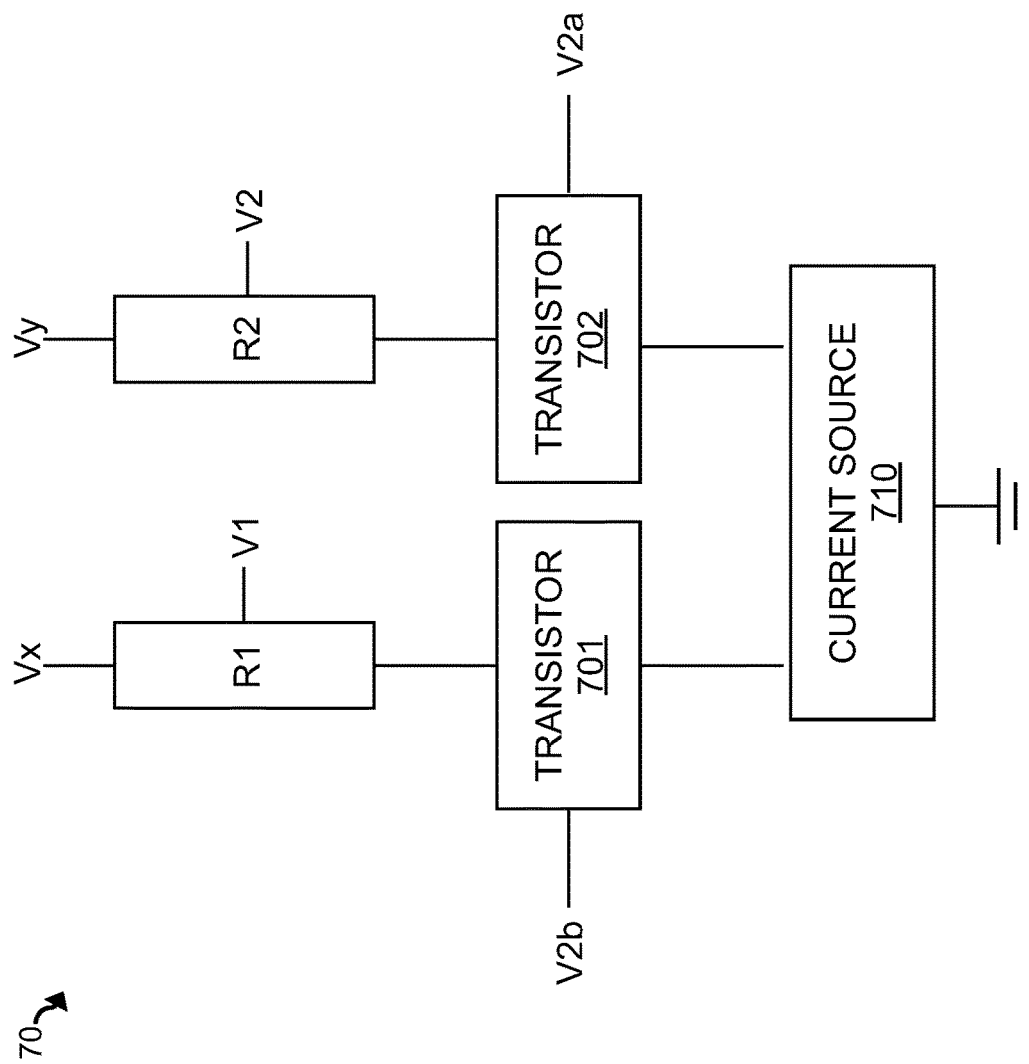
FIG. 7 is a block diagram of a variable-threshold circuit according to another embodiment.

FIG. 7 is a block diagram of a variable-threshold circuit 70 according to another embodiment. In this embodiment, a differential pair injects a current offset in a symmetric load (e.g., a resistor load), resulting in a target voltage offset buffer. The inputs to the differential pair come from two additional voltages, V2a and V2b, and drive the current through each half in different amounts, depending on the input of the differential pair.

The variable-threshold circuit 70 includes resistors R1, R2, transistors 701, 702, and a current source 710. A first terminal of resistor R1 is electrically coupled to the regulator output voltage Vx. A second terminal of resistor R1 is electrically coupled to transistor 701. The transistor 701 is further electrically coupled to voltage V2b and the current source 710. A first terminal of resistor R2 is electrically coupled to the target supply voltage Vy. A second terminal of resistor R2 is electrically coupled to transistor 702. The transistor 702 is further electrically coupled to voltage V2a and the current source 710.

Figure 8:
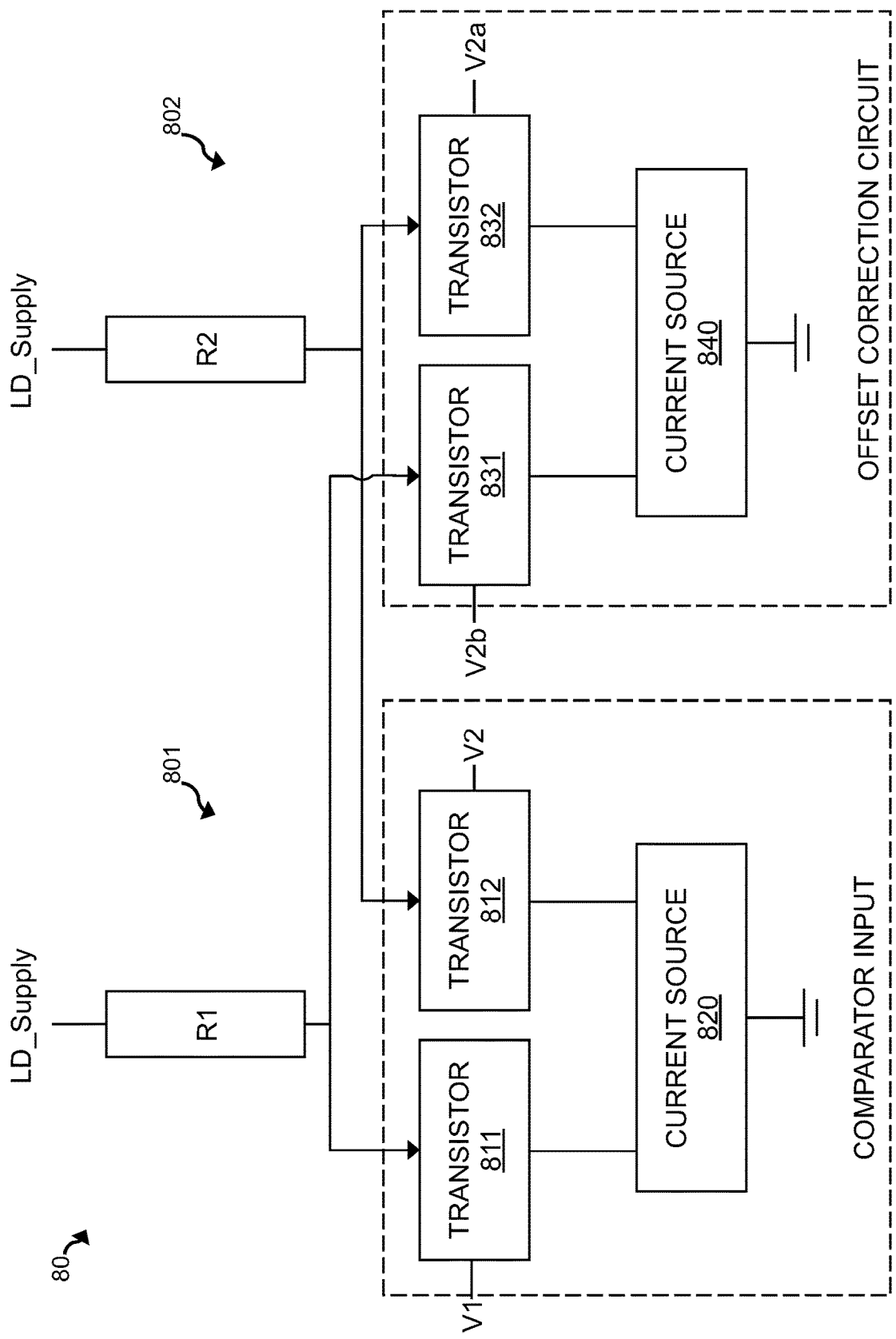
FIG. 8 is a block diagram of a variable-threshold circuit according to another embodiment.

FIG. 8 is a block diagram of a variable-threshold circuit 80 according to another embodiment. A first differential pair 801 receives the outputs of the level shifter (V1 and V2) (e.g., level-shifter circuit 200 (FIGS. 2-4). A second differential pair 802 receives voltages V2a and V2b that are used to trim the offset voltage (or adjust the threshold). The second differential pair 802 injects a current in parallel with the first differential pair 801, effectively creating a non-zero threshold.

The variable-threshold circuit 80 includes resistors R1, R2, transistors 811, 812, 831, 832, and current sources 820, 840. The first terminal of each resistor R1, R2 is electrically coupled to the supply. The second terminal of R1 is electrically coupled to transistors 811 and 831. The second terminal of R2 is electrically coupled to transistors 812 and 832. Transistors 811 and 812 are electrically coupled to current source 820. Transistors 831 and 832 are electrically coupled to current source 840.

The output of the differential pairs 801 and 802 can be provided as an input to the comparator 210.

Figure 9:
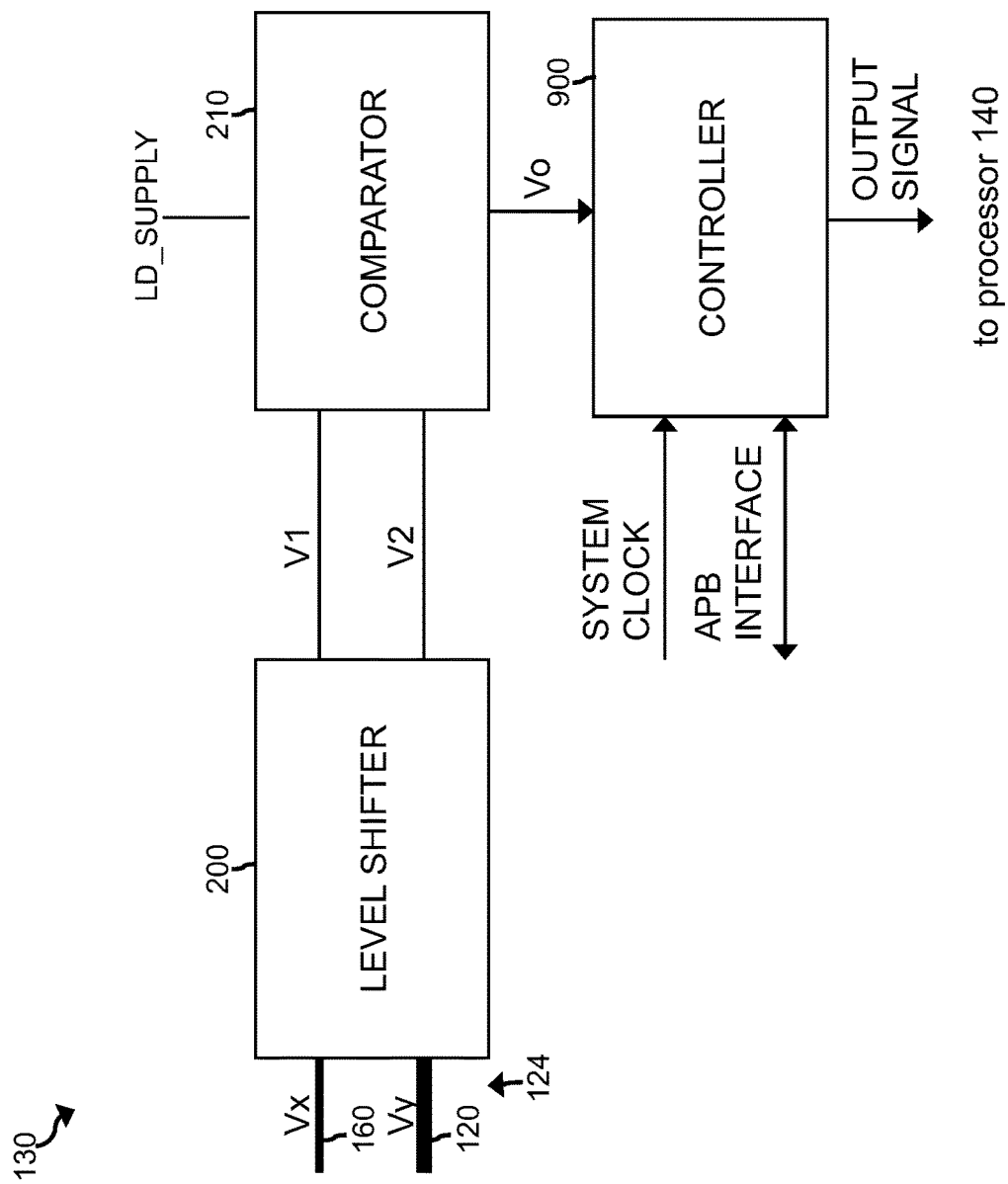
FIG. 9 is a block diagram of the latchup detector illustrated in FIG. 1 according to another embodiment.

FIG. 9 is a block diagram of the latchup detector 130 according to another embodiment. In this embodiment, the output of the comparator 210 is electrically coupled and/or electrically connected to the input of a digital controller 900. The digital controller 900 can include or can be a digital state machine. The digital controller 900 receives as inputs the output voltage Vo produced by the comparator 210 and interprets the output voltage Vo as a digital signal (1 or 0). The controller 900 can be configured to perform offset calibration that programs the variable threshold circuit 50 and/or digital filtering to reduce false positives (i.e., false detection of latchup events). The digital controller 900 can be implemented in software, hardware, or a combination of software and hardware.

Figure 6:
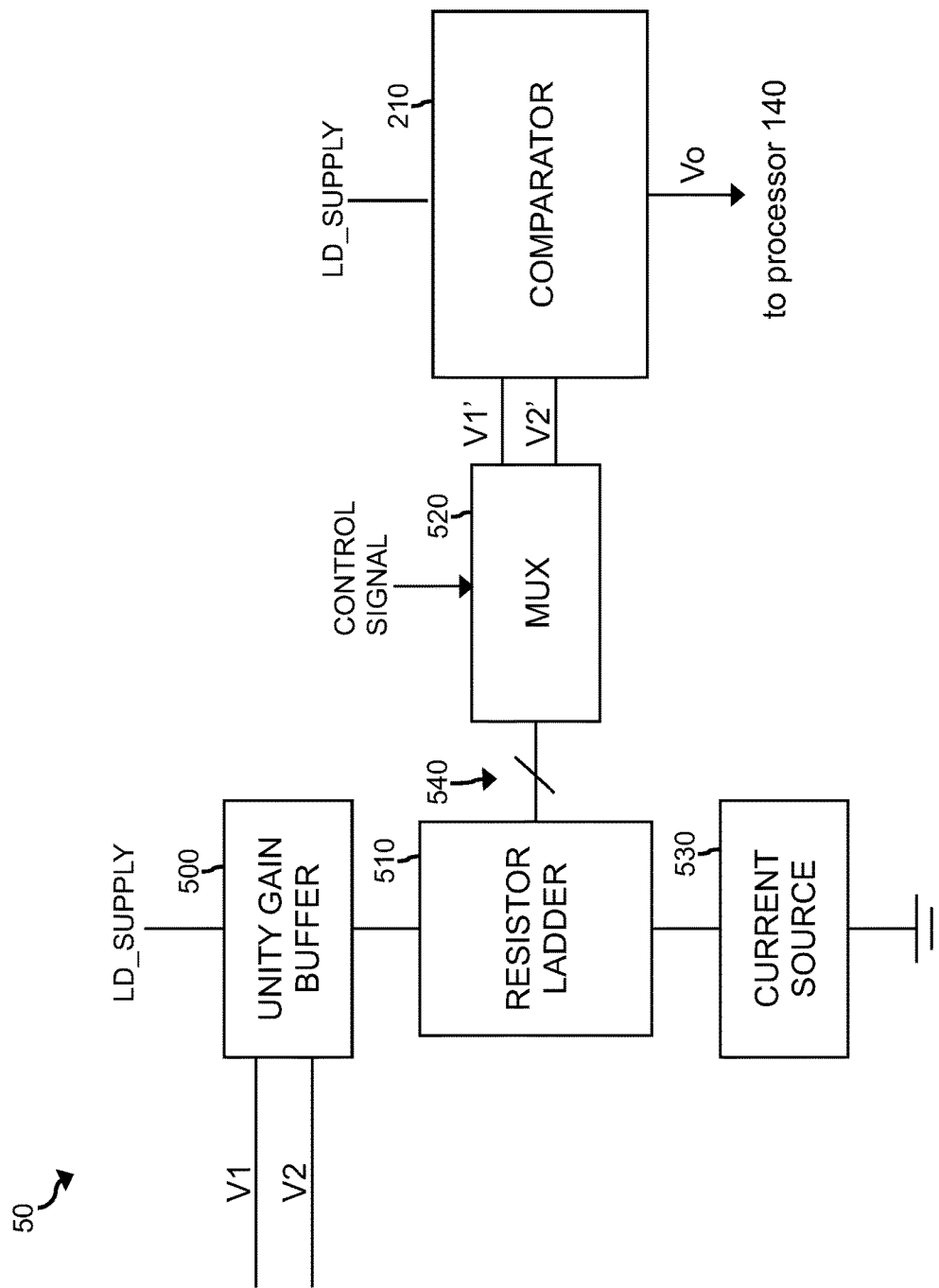
FIG. 6 is a block diagram of a combined circuit that includes a variable-threshold circuit and a comparator.

A foreground calibration routine can be implemented using a digital state machine (e.g., digital controller 900) in conjunction with the variable-threshold circuit 50 (FIGS. 5, 6). In the foreground calibration routine, the output voltage Vo of the comparator 210 is monitored, and the digital state machine contains an accumulator that converges towards the required state (e.g., no latchup event). This convergence can be managed through several potential solutions, such as a counter-based accumulator or an accumulator that low-pass filters the comparator 210 voltage Vo. Thus, the steady state is a point of close to 0 offset. For example, the digital state machine and/or digital controller 900 can cause the predetermined voltage difference of the variable-threshold circuit to be varied (e.g., by sending a control signal to the multiplexer 520) until the output voltage Vo of the comparator 210 converges to a voltage that represents a no-latchup state.

Additionally or alternatively, the digital controller 900 can include a digital filter to average out the digital-signal representation of the output voltage Vo to reduce the effect of noise, such as dynamic IR drops, on the detector. For example, a time-weighted average of the accumulated value of the digital-signal representation of the output voltage Vo can be used. In a specific example, the set point or threshold of the time-weighted average can be set to 0.25 (e.g., greater than 0 and less than 0.5) where a digital 1 represents a latchup event and a digital 0 represents normal operation. When the time-weighted average is greater than or equal to the set point, the digital controller 900 can produce an output signal, such as interrupt signal, that indicates that a latchup event has occurred. The interrupt signal can be a persistent interrupt signal such that the interrupt is maintained even if the time-weighted average falls below the set point. When the time-weighted average is lower than the set point, the digital controller 900 does not produce an output signal. Alternatively, the digital controller 900 can produce a first output signal (e.g., an interrupt output signal) when the time-weighted average is greater than or equal to the set point and a second output signal when the time-weighted average is lower than the set point.

Figure 10:
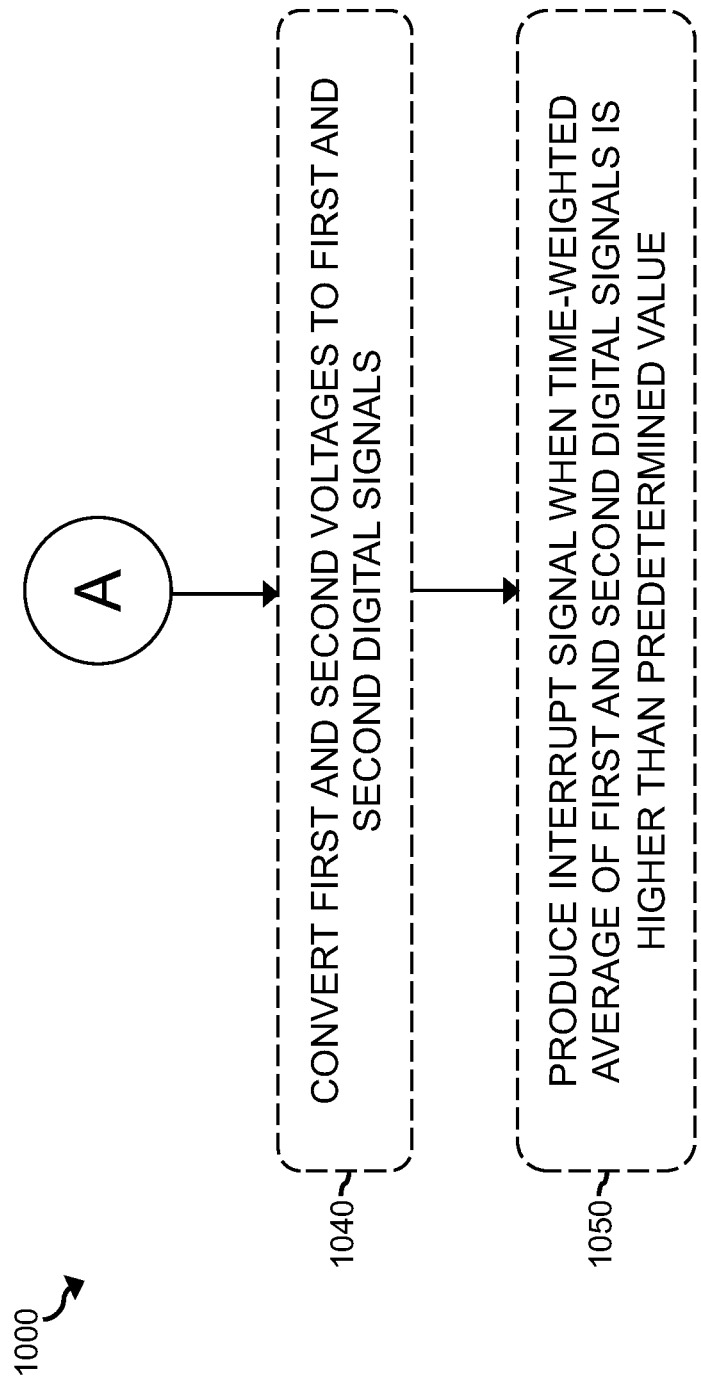
FIG. 10 is a flow chart of a method for detecting a latchup event according to an embodiment.

FIG. 10 is a flow chart of a method 1000 for detecting a latchup event according to an embodiment. Method 1000 can be performed with system 10 or latchup detector 130.

In step 1001, a first level-shifter circuit (e.g., first level-shifter circuit 300) lowers the regulator output voltage Vx to a first voltage. The first level-shifter circuit preferably proportionally lowers the regulator output voltage Vx to the first voltage.

In step 1010, a second level-shifter circuit (e.g., second level-shifter circuit 310) lowers the target supply voltage Vy to a second voltage. The second level-shifter circuit preferably proportionally lowers the target supply voltage Vy to the second voltage.

In step 1020, a comparator (e.g., comparator 210) produces a first output voltage when the difference between the first and second voltages is greater than or equal to a predetermined voltage difference. The first output voltage can indicate that a latchup even has occurred.

In step 1030, the comparator produces a second output voltage when the difference between the first and second voltages is less than the predetermined voltage difference. The second output voltage can indicate normal operation of the circuit, including normal levels of the regulator output voltage Vx and the target supply voltage Vy.

In some embodiments, the method 1000 includes optional steps 1040 and 1050.

In optional step 1040, a digital controller converts the first and second output voltages into first and second digital signals, respectively. The digital controller has an input electrically to an output of the comparator to receive the first and second voltages.

In optional step 1050, the digital controller produces an interrupt signal when a time-weighted average of the first and second digital signals is greater than a predetermined value.

Figure 11:
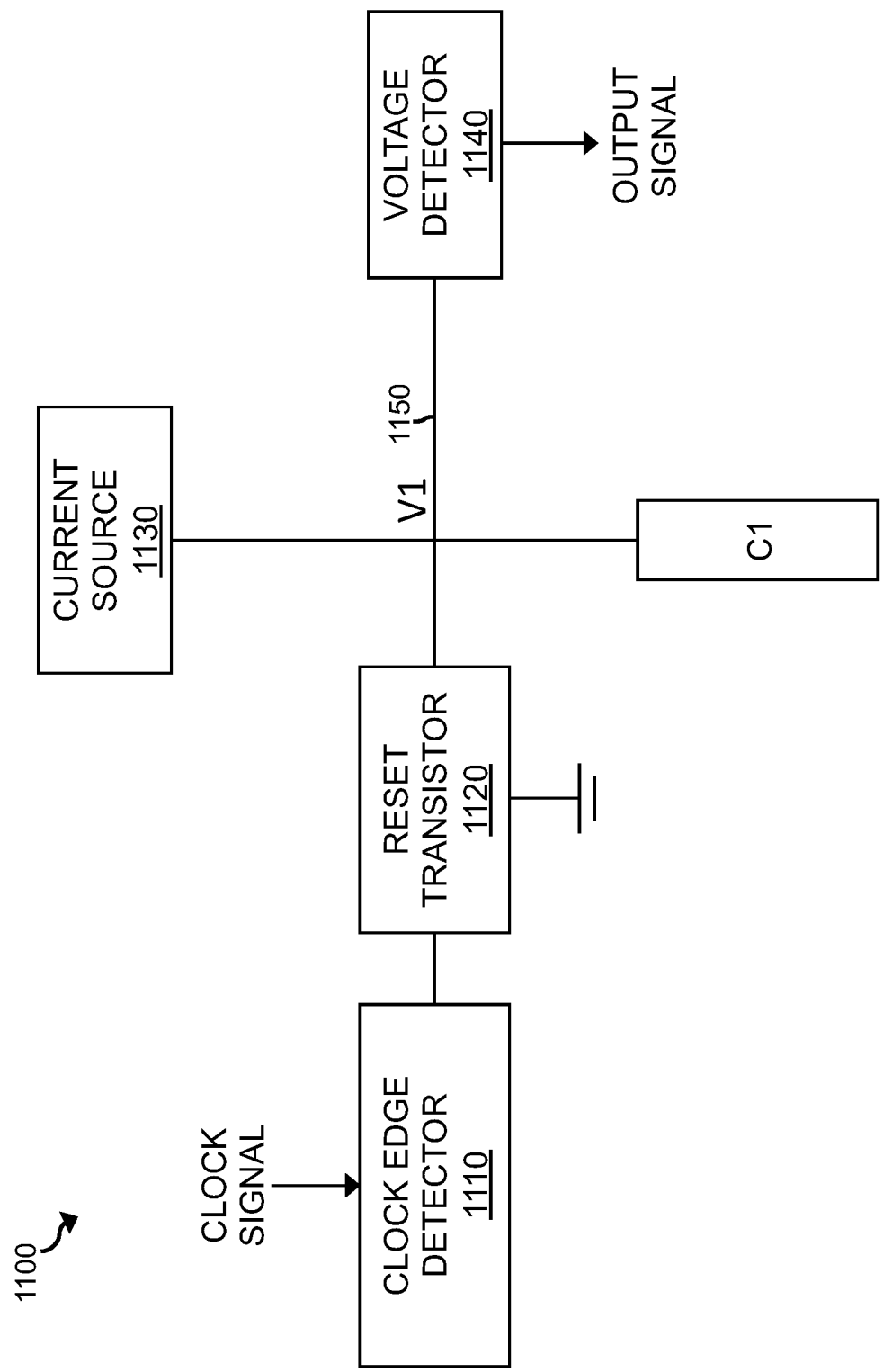
FIG. 11 is a block diagram of a clock loss detection circuit according to an embodiment.

FIG. 11 is a block diagram of a clock loss detection circuit 1100 according to an embodiment. The circuit 1100 includes a clock edge detector 1110, a reset transistor 1120, a current source 1130, a capacitor C1, and a voltage detector 1140.

The clock edge detector 1110 is configured to output a pulse (e.g., a voltage pulse) every time the clock edge detector 1110 detects a clock rising edge and/or a clock falling edge. The pulse turns on, the reset transistor 1120 is electrically coupled to ground (or to a first voltage) which shorts V1 to ground (or to the first voltage). An output line 1150 having an output voltage V1 is electrically coupled to the reset transistor 1120 and the voltage detector 1140.

The pulse is only high for a short duration of time (e.g., for less than or equal to about 1 ns, such as about 100 ps to about 500 ps). before going low again. When the pulse is low, the reset transistor 1120 turns off to disconnect the resistor transistor 1120 from ground. When the reset transistor 1120 is off, current charges up the capacitor C1 over time (e.g., from 0 to the supply voltage). The voltage detector 1140 monitors the voltage V1 across the capacitor C1. When the voltage V1 increases above a predetermined maximum voltage, the voltage detector 1140 is configured to produce a first output signal which can be a digital 1. While the voltage V1 is at or below the predetermined maximum voltage, the voltage detector 1140 is configured to produce a second output signal which can be a digital 0.

The current (e.g., produced by current source 1130) and capacitor C1 are configured so that V1 only activates the detector after a certain time (where the clock rising and/or falling edge has been missing for that time). Both can be programmable to change the detection time. The digital 1 can be stored as a persistent interrupt that the SoC can then monitor. The persistent interrupt can be reset by the SoC.

The voltage detector 1140 can be implemented in several ways. In one embodiment, the voltage detector 1140 can include a comparator, where one input is based on a reference voltage and the other input is the voltage V1. In one example, the reference voltage can be driven from a resistor divider from the power supply. In another embodiment, the voltage detector 1140 can include an amplifier, where the transistor threshold voltage of the resistor transistor 1120 acts as the reference voltage (e.g., the amplifier only turns on if V1 is larger than the transistor threshold voltage).

In some embodiments, the current source 1130 include a resistor electrically coupled in series with the power supply. The capacitor C1 would be reset to ground when the clock edge arrives. The resistor connects the capacitor C1 to the power supply and charges the capacitor C1 to the supply voltage.

Figure 12:
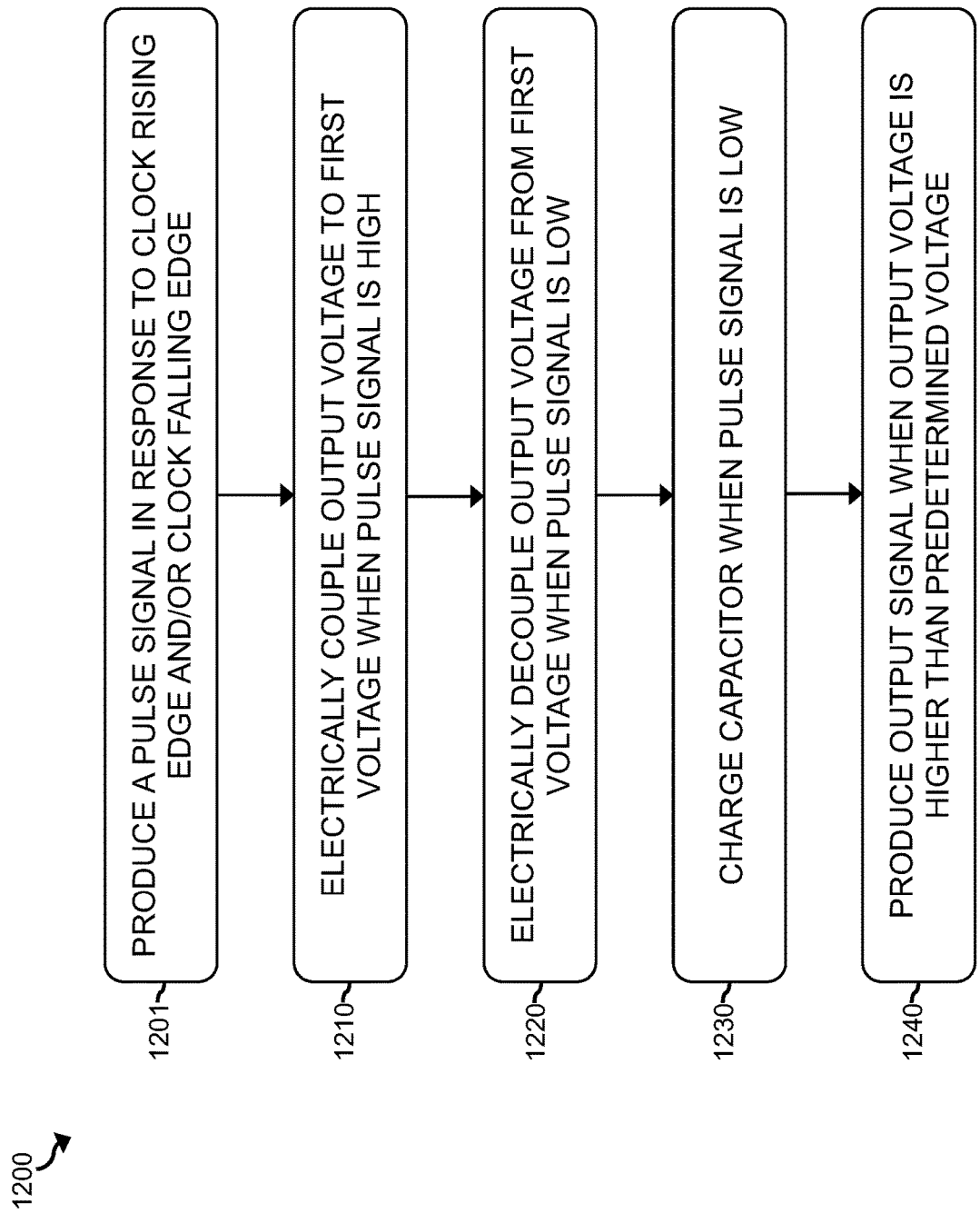
FIG. 12 is a flow chart of a method for detecting clock loss according to an embodiment.

FIG. 12 is a flow chart of a method 1200 for detecting clock loss according to an embodiment. The method 1200 can be performed with circuit 1100.

In step 1201, the clock edge detector 1110 produces a pulse signal in response to the detection of each rising and/or each falling edge of a clock signal.

In step 1210, the output voltage V1 is electrically coupled to a first voltage when the pulse signal is high. The output voltage V1 can be the voltage of output line 1150. The first voltage can be ground (i.e., 0 V) or another voltage. The output voltage V1 is electrically coupled to the first voltage with a transistor or switch (e.g., reset transistor 1120) that is in a first state in which the transistor or switch is electrically coupled to the first voltage.

In step 1220, the output voltage V1 is electrically decoupled from the first voltage when the pulse signal is low. In this step, the transistor or switch (e.g., reset transistor 1120) is in a second state in which the transistor or switch is electrically decoupled from the first voltage.

In step 1230, the capacitor C1 is charged when the pulse signal is low. The capacitor C1 is electrically coupled to the output line 1150. When the pulse signal is low, the transistor or switch is electrically decoupled from the first voltage, thus allowing the capacitor C1 to charge from a current source (e.g., current source 1130) that is electrically coupled to the capacitor C1.

In step 1240, an output signal is produced when the output voltage V1 is higher than a predetermined value. The output voltage V1 can be measured with a voltage detector, such as voltage detector 1140, that is electrically coupled to the output line. In some embodiment, the voltage detector can produce a first output signal when or while the output voltage V1 is lower than or equal to the predetermined value and a second output signal when or while the output voltage V1 is higher than or equal to the predetermined value.

The invention should not be considered limited to the particular embodiments described above. Various modifications, equivalent processes, as well as numerous structures to which the invention may be applicable, will be readily apparent to those skilled in the art to which the invention is directed upon review of this disclosure. The above-described embodiments may be implemented in numerous ways. One or more aspects and embodiments involving the performance of processes or methods may utilize program instructions executable by a device (e.g., a computer, a processor, or other device) to perform, or control performance of, the processes or methods.

In this respect, various inventive concepts may be embodied as a non-transitory computer readable storage medium (or multiple non-transitory computer readable storage media) (e.g., a computer memory of any suitable type including transitory or non-transitory digital storage units, circuit configurations in Field Programmable Gate Arrays or other semiconductor devices, or other tangible computer storage medium) encoded with one or more programs that, when executed on one or more computers or other processors, perform methods that implement one or more of the various embodiments described above. When implemented in software (e.g., as an app), the software code may be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smartphone or any other suitable portable or fixed electronic device.

Also, a computer may have one or more communication devices, which may be used to interconnect the computer to one or more other devices and/or systems, such as, for example, one or more networks in any suitable form, including a local area network or a wide area network, such as an enterprise network, and intelligent network (IN) or the Internet. Such networks may be based on any suitable technology and may operate according to any suitable protocol and may include wireless networks or wired networks.

Also, a computer may have one or more input devices and/or one or more output devices. These devices can be used, among other things, to present a user interface. Examples of output devices that may be used to provide a user interface include printers or display screens for visual presentation of output and speakers or other sound generating devices for audible presentation of output. Examples of input devices that may be used for a user interface include keyboards, and pointing devices, such as mice, touch pads, and digitizing tablets. As another example, a computer may receive input information through speech recognition or in other audible formats.

The non-transitory computer readable medium or media may be transportable, such that the program or programs stored thereon may be loaded onto one or more different computers or other processors to implement various one or more of the aspects described above. In some embodiments, computer readable media may be non-transitory media.

The terms "program," "app," and "software" are used herein in a generic sense to refer to any type of computer code or set of computer-executable instructions that may be employed to program a computer or other processor to implement various aspects as described above. Additionally, it should be appreciated that, according to one aspect, one or more computer programs that when executed perform methods of this application need not reside on a single computer or processor, but may be distributed in a modular fashion among a number of different computers or processors to implement various aspects of this application.

Computer-executable instructions may be in many forms, such as program modules, executed by one or more computers or other devices. Generally, program modules include routines, programs, objects, components, data structures, etc. that performs particular tasks or implement particular abstract data types. The functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Thus, the disclosure and claims include new and novel improvements to existing methods and technologies, which were not previously known nor implemented to achieve the useful results described above. Users of the method and system will reap tangible benefits from the functions now made possible on account of the specific modifications described herein causing the effects in the system and its outputs to its users. It is expected that significantly improved operations can be achieved upon implementation of the claimed invention, using the technical components recited herein.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

What is claimed is:

1. A latchup detector comprising:
    a level shifter comprising:
        a first level-shifter circuit having an input electrically coupled to an output of a voltage regulator, the output having a regulator output voltage, the first level-shifter circuit configured to lower the regulator output voltage to a first voltage; and
        a second level-shifter circuit having an input electrically coupled to an input of a chip, the input of the chip having a target supply voltage, the second level-shifter circuit configured to lower the target supply voltage to a second voltage, the second voltage lower than the first voltage,
        wherein a voltage supply rail is electrically coupled to the output of the voltage regulator and to the input of the chip; and
    a comparator having a first input electrically coupled to an output of the first level-shifter circuit to receive the first voltage and a second input electrically coupled to an output of the second level-shifter circuit to receive the second voltage, the comparator configured to produce a first output voltage when a difference between the first and second voltages is greater than or equal to a predetermined voltage difference and a second output voltage when the difference between the first and second voltages is less than the predetermined voltage difference;
    wherein the comparator has a variable-threshold such that the predetermined voltage difference is programmable.

2. The latchup detector of claim 1, wherein the first and second voltages are lower than a latchup threshold voltage.

3. The latchup detector of claim 2, wherein the latchup threshold voltage is less than or equal to about 0.9V and greater than or equal to about 0.75V.

4. The latchup detector of claim 1, further comprising:
    a unity gain buffer having a first input electrically coupled to the output of the first level-shifter circuit and a second input electrically coupled to the output of the second level-shifter circuit;
    a resistor ladder having an input electrically coupled to an output of the unity gain buffer; and
    a multiplexer selectively electrically coupled to one or more resistors in the resistor ladder, the multiplexer having an output electrically coupled to the comparator.

5. The latchup detector of claim 4, wherein the resistor(s) to which the multiplexer is electrically coupled corresponds to a programmability of the predetermined voltage difference.

6. The latchup detector of claim 1, wherein the first voltage corresponds to an interrupt signal for the chip.

7. A latchup detector comprising:
    a level shifter comprising:
        a first level-shifter circuit having an input electrically coupled to an output of a voltage regulator, the output having a regulator output voltage, the first level-shifter circuit configured to lower the regulator output voltage to a first voltage; and
        a second level-shifter circuit having an input electrically coupled to an input of a chip, the input of the chip having a target supply voltage, the second level-shifter circuit configured to lower the target supply voltage to a second voltage, the second voltage lower than the first voltage,
    wherein a voltage supply rail is electrically coupled to the output of the voltage regulator and to the input of the chip; and
a comparator having a first input electrically coupled to an output of the first level-shifter circuit to receive the first voltage and a second input electrically coupled to an output of the second level-shifter circuit to receive the second voltage, the comparator configured to produce a first output voltage when a difference between the first and second voltages is greater than or equal to a predetermined voltage difference and a second output voltage when the difference between the first and second voltages is less than the predetermined voltage difference;
wherein:
the latchup detector further comprises a digital controller having an input electrically to an output of the comparator to receive the first and second output voltages, the digital controller configured to:
    convert the first and second output voltages into first and second digital signals, respectively, and
    produce an interrupt signal when a time-weighted average of the first and second digital signals is greater than a predetermined value.

8. The latchup detector of claim 7, wherein an output of the digital controller is electrically coupled to a processor on the chip to receive the interrupt signal.

9. The latchup detector of claim 7, wherein the interrupt signal comprises a persistent interrupt signal.

10. The latchup detector of claim 1, wherein:
the latchup detector further comprises a digital state machine having an input electrically to an output of the comparator to receive the first and second output voltages, the digital state machine configured to:
    convert the first and second output voltages into first and second digital signals, respectively; and
    pass a conversion of the first and second digital signals through an accumulator that converges towards a target state.

11. A method for detecting a latchup event, comprising:
in a latchup detector comprising:
    a level shifter comprising:
        a first level-shifter circuit having an input electrically coupled to an output of a voltage regulator, the output having a regulator output voltage; and
        a second level-shifter circuit having an input electrically coupled to an input of a chip, the input of the chip having a target supply voltage,
        wherein a voltage supply rail is electrically coupled to the output of the voltage regulator and to the input of the chip; and
    a comparator having a first input electrically coupled to an output of the first level-shifter circuit to receive a first voltage and a second input electrically coupled to an output of the second level-shifter circuit to receive a second voltage,
wherein the method comprises:
    lowering the regulator output voltage, with the first level-shifter circuit, to the first voltage;
    lowering the target supply voltage, with the second level-shifter circuit, to the second voltage;
    producing, with the comparator, a first output voltage when a difference between the first and second voltages is greater than or equal to a predetermined voltage difference; and
    producing, with the comparator, a second output voltage when the difference between the first and second voltages is less than the predetermined voltage difference;
    wherein the comparator has a variable-threshold and the method further comprises programmably setting the predetermined voltage difference.

12. The method of claim 11, wherein the first and second voltages are lower than a latchup threshold voltage.

13. A method for detecting a latchup event, comprising:
in a latchup detector comprising:
    a level shifter comprising:
        a first level-shifter circuit having an input electrically coupled to an output of a voltage regulator, the output having a regulator output voltage; and
        a second level-shifter circuit having an input electrically coupled to an input of a chip, the input of the chip having a target supply voltage,
        wherein a voltage supply rail is electrically coupled to the output of the voltage regulator and to the input of the chip; and
    a comparator having a first input electrically coupled to an output of the first level-shifter circuit to receive a first voltage and a second input electrically coupled to an output of the second level-shifter circuit to receive a second voltage,
wherein the method comprises:
    lowering the regulator output voltage, with the first level-shifter circuit, to the first voltage;
    lowering the target supply voltage, with the second level-shifter circuit, to the second voltage;
    producing, with the comparator, a first output voltage when a difference between the first and second voltages is greater than or equal to a predetermined voltage difference; and
    producing, with the comparator, a second output voltage when the difference between the first and second voltages is less than the predetermined voltage difference;
further comprising:
    with a digital controller having an input electrically to an output of the comparator to receive the first and second voltages:
        converting the first and second output voltages into first and second digital signals, respectively; and
        producing an interrupt signal when a time-weighted average of the first and second digital signals is greater than a predetermined value.

* * * * *